(12) United States Patent
Lee et al.

(10) Patent No.: US 12,442,898 B2
(45) Date of Patent: Oct. 14, 2025

(54) OPTICAL SENSING DEVICE

(71) Applicant: SAMSUNG ELECTRONICS CO., LTD., Suwon-si (KR)

(72) Inventors: Eunkyung Lee, Seoul (KR); Kyoungho Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1125 days.

(21) Appl. No.: 17/378,238

(22) Filed: Jul. 16, 2021

(65) Prior Publication Data
US 2022/0283270 A1 Sep. 8, 2022

(30) Foreign Application Priority Data
Mar. 4, 2021 (KR) .................. 10-2021-0029054

(51) Int. Cl.
*G01S 7/481* (2006.01)
*H05K 7/20* (2006.01)

(52) U.S. Cl.
CPC ........ *G01S 7/4813* (2013.01); *H05K 7/20863* (2013.01)

(58) Field of Classification Search
CPC ................... G01S 7/4813; H05K 7/20863
See application file for complete search history.

(56) References Cited

U.S. PATENT DOCUMENTS

| 10,729,034 B2* | 7/2020 | Zaindl .................... F25B 9/004 |
| 2008/0062038 A1* | 3/2008 | Ouchi ..................... G01S 7/032 |
| | | 342/175 |
| 2011/0083446 A1* | 4/2011 | Pinet ....................... F25B 21/02 |
| | | 62/3.6 |
| 2013/0322892 A1 | 12/2013 | Aflatouni et al. |
| 2015/0055297 A1* | 2/2015 | Chilek .............. H05K 7/20136 |
| | | 361/714 |
| 2017/0261273 A1* | 9/2017 | Maranville ........... G01S 17/931 |
| 2019/0154799 A1* | 5/2019 | Schmidt ................ G01S 17/42 |
| 2019/0278078 A1* | 9/2019 | Krishnan ............... G01S 17/88 |
| 2020/0309913 A1* | 10/2020 | Oliveira ..................... F28F 5/00 |
| 2021/0063093 A1* | 3/2021 | Tobiassen ............... G01S 17/88 |
| 2021/0068312 A1* | 3/2021 | Tobiassen .......... H01M 10/663 |
| 2022/0034690 A1* | 2/2022 | Surineedi .............. G01S 17/931 |
| 2022/0357426 A1* | 11/2022 | Krishnan ............. G01S 17/931 |

FOREIGN PATENT DOCUMENTS

| JP | 2000056008 A | * | 2/2000 |
| KR | 1020170017481 A | | 2/2017 |
| KR | 1020190021023 A | | 3/2019 |

\* cited by examiner

*Primary Examiner* — Devon Lane
(74) *Attorney, Agent, or Firm* — Sughrue Mion, PLLC

(57) ABSTRACT

An optical sensing device includes: an optical sensor provided on a substrate and configured to radiate light to the outside of a housing through an optical window, and to receive the light that returns to the housing through the optical window; and a heat conductive member connected to the optical sensor and the housing and configured to conduct heat from the optical sensor to the housing.

20 Claims, 13 Drawing Sheets

OPTICAL SENSING DEVICE

CROSS-REFERENCE TO RELATED APPLICATION(S)

This application is based on and claims priority under 35 U.S.C. § 119 to Korean Patent Application No. 10-2021-0029054, filed on Mar. 4, 2021, in the Korean Intellectual Property Office, the disclosure of which is incorporated by reference herein in its entirety.

BACKGROUND

1. Field

Apparatuses and methods consistent with example embodiments relate to an optical sensing device for detecting information about an object by radiating light onto the object and receiving reflected light therefrom.

2. Description of the Related Art

Light sensing devices, for example, Light Detection and Ranging (LiDAR) devices, are used as sensors or scanners for detecting obstacles by various autonomous driving devices such as smart cars and robots.

In general, a LiDAR device includes a light source for radiating light to an object and a light-receiving portion for receiving light reflected from the object. Various additional optical components may be arranged in an optical path along which the light source is directed toward the object and an optical path between the object and a sensor. Heat may be generated during the operation of the LiDAR device. Heat may negatively affect the luminous performance of the light source, for example, light wavelength, light intensity, and the like. Therefore, cooling of the LiDAR device may be required.

SUMMARY

One or more example embodiments provide optical sensing devices capable of effectively dissipating heat generated during operation.

Further, one or more example embodiments provide optical sensing devices with improved operational reliability.

According to an aspect of an example embodiment, there is provided an optical sensing device including: a housing having an optical window; a substrate provided in the housing; an optical sensor provided on the substrate and configured to radiate light to an outside of the housing through the optical window and to receive the light that returns to the housing through the optical window; and a heat conductive member connected to the optical sensor and the housing to conduct heat from the optical sensor to the housing.

The heat conductive member may include a cooling plate contacting the optical sensor and a cooling fin connecting the cooling plate to the housing.

The optical sensing device may further include: a thermoelectric cooler provided between the optical sensor and the heat conductive member.

The optical sensing device may further include: a driver provided on the substrate to drive the optical sensor, wherein the heat conductive member may connect the driver to the housing.

The housing may have a streamlined shape.

The optical sensing device may further include: a cover plate provided above an outer periphery of the housing to form a cooling channel between the cover plate and the housing and thereby to allow a fluid to flow along the outer periphery of the housing.

The optical sensing device may further include: a fan configured to supply air to the cooling channel.

The optical sensing device may further include: an air vent provided in the housing; and a fan configured to exhaust air from an inside of the housing to the outside of the housing.

An inner space of the housing may include a first space and a second space separated by an isolation plate. The substrate and the optical sensor may be provided in the first space, and the heat conductive member may be provided in the second space. The air vent may be configured to communicate with the second space, and the fan may be configured to exhaust the air from the second space to the outside.

The heat conductive member may include a cooling plate contacting the optical sensor and a cooling fin connecting the cooling plate to the housing, and the isolation plate may be extended from the cooling plate to divide the inner space into the first space and the second space.

The optical sensing device may further include: a cover plate provided above an outer periphery of the housing to form a cooling channel between the cover plate and the housing and thereby to allow a fluid to flow along the outer periphery of the housing, wherein the air vent may be provided in an area of the housing corresponding to the cooling channel.

According to an aspect of an example embodiment, there is provided a housing having an optical window; a light emitter provided in the housing and configured to radiate light to an outside of the housing through the optical window; a light receiver provided in the housing and configured to receive the light that returns to the housing through the optical window; and a heat conductive member comprising: a cooling plate contacting the light emitter; and a cooling fin connected to the cooling plate and the housing and configured to conduct heat from the light emitter to the housing.

The optical sensing device may further include: a driver configured to drive the light emitter and the light receiver, wherein the cooling plate may be in contact with the driver.

The optical sensing device may further include: a thermoelectric cooler provided between the light emitter and the cooling plate.

The optical sensing device may further include: a cover plate provided above an outer periphery of the housing and to form a cooling channel between the cover plate and the housing and thereby to allow a fluid to flow along the outer periphery of the housing.

The optical sensing device may further include: an air vent provided in the housing; and a fan configured to exhaust air from inside the housing to the outside.

An inner space of the housing may include a first space and a second space separated by an isolation plate. The light emitter and the light receiver may be provided in the first space, the heat conductive member is provided in the second space. The air vent may be configured to communicate with the second space. The fan may be configured to exhaust the air from the second space to the outside.

The isolation plate may be formed as a part of the cooling plate.

The optical sensing device may further include: a cover plate provided above an outer periphery of the housing to form a cooling channel between the cover plate and the housing to allow a fluid to flow along the outer periphery of the housing, wherein the air vent may be provided in an area of the housing corresponding to the cooling channel.

BRIEF DESCRIPTION OF THE DRAWINGS

The above and/or other aspects will be more apparent by describing certain example embodiments, with reference to the accompanying drawings, in which.

DETAILED DESCRIPTION

Figure 1:
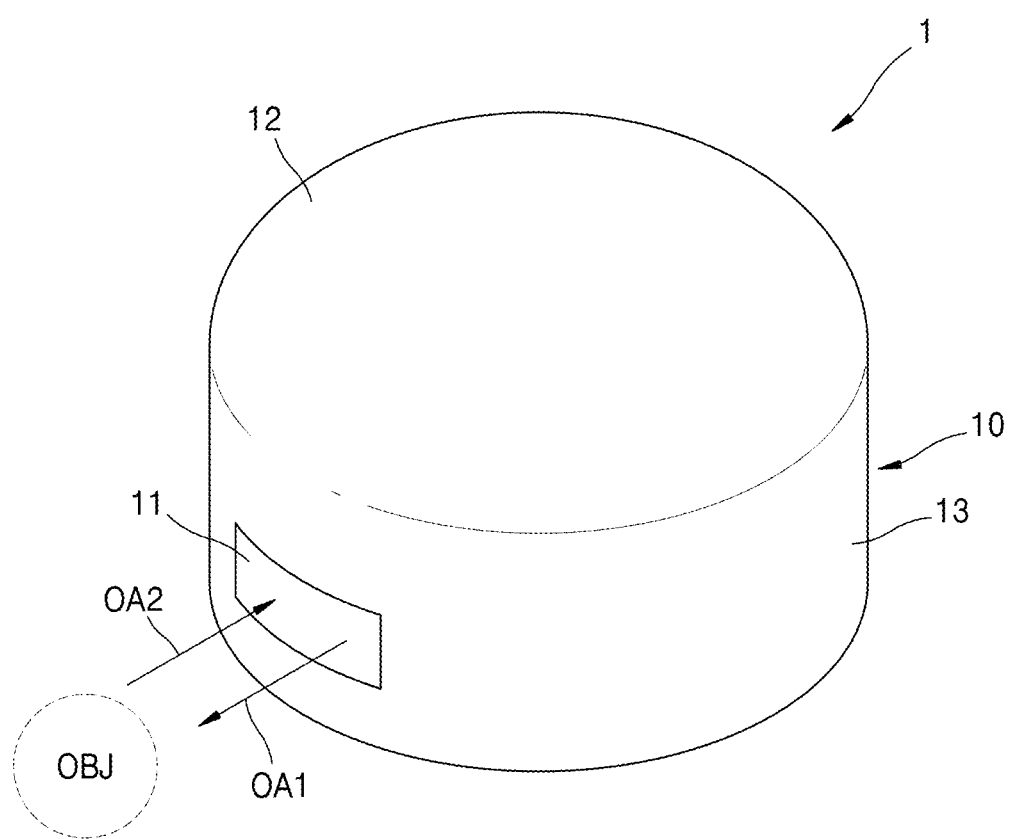
FIG. 1 is a perspective view of an example embodiment of an optical sensing device.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

For example, when an element is referred to as being "on" or "above" another element, it may be directly on the other element, or intervening elements may also be present.

It will be understood that, although the terms first, second, etc. may be used herein to describe various elements, these elements should not be limited by these terms. These terms are used only to distinguish one component from another.

As used herein, the singular forms "a," "an," and "the" are intended to include the plural forms as well, unless the context clearly indicates otherwise. In addition, it will be understood that when a unit is referred to as "comprising" another element, it does not preclude the possibility that one or more other elements may exist or may be added.

In addition, the terms "-er", "-or", and "module" described in the specification mean units for processing at least one function and/or operation and can be implemented by hardware components or software components and combinations thereof.

Figure 2:
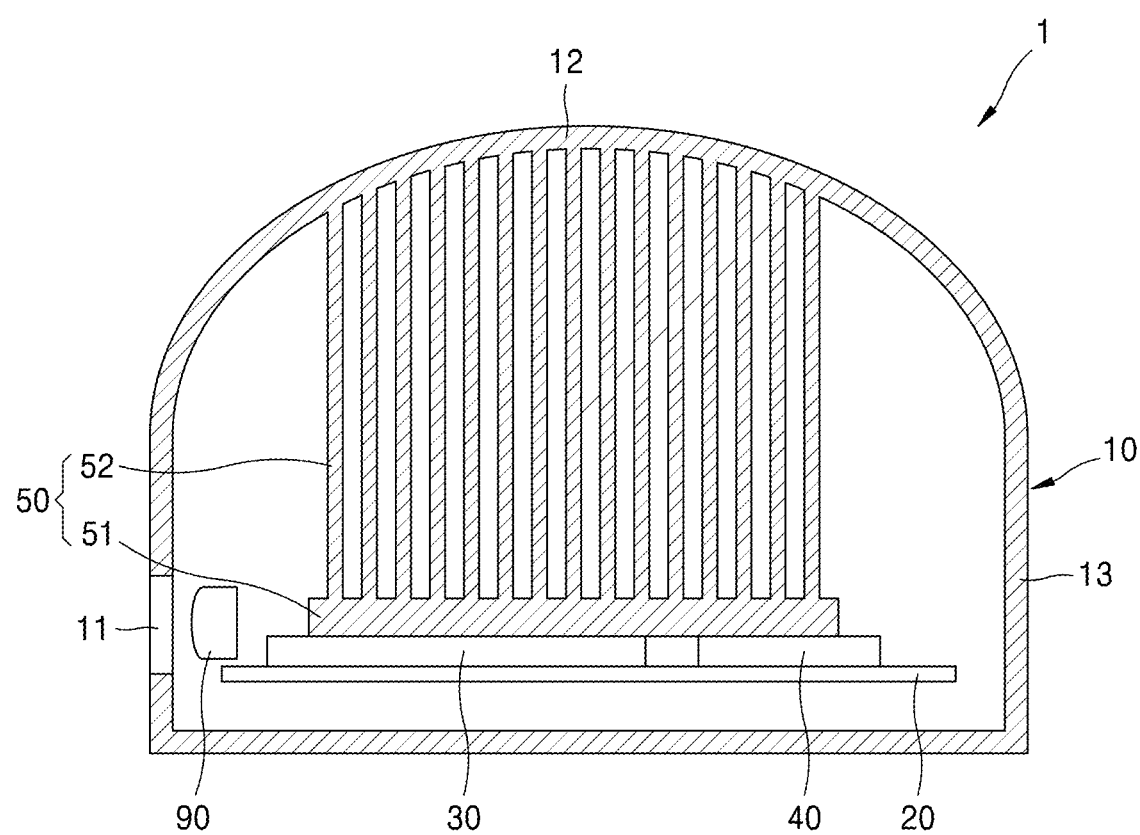
FIG. 2 is a cross-sectional view of an example embodiment of the optical sensing device shown in FIG. 1.

FIG. 1 is a perspective view of an optical sensing device according to an example embodiment. FIG. 2 is a schematic cross-sectional view of an example embodiment of the optical sensing device shown in FIG. 1. An optical sensing device 1 of the present embodiment may be, for example, a LiDAR device. The LiDAR device may irradiate an object with an optical pulse signal, such as a laser pulse signal, from a light-emitting portion, and may use a Time-of-flight (TOF) method that measures a distance using a time difference in which a reflected signal reflected from the object arrives at a light-receiving portion, and a phase-shift method that measures the amount of reflection phase change of a laser beam modulated at a specific frequency.

Referring to FIGS. 1 and 2, the optical sensing device 1 radiate light OA1 to an object OBJ and receives reflected light OA2 reflected from the object OBJ to receive information about the object OBJ, for example, a distance to the object OBJ, a location of the object OBJ, and the speed of the object OBJ. An example embodiment of the optical sensing device 1 may include a housing 10 having an optical window 11, a substrate 20 in the housing 10, an optical sensor 30 located on the substrate 20 to radiate the light OA1 to the outside of the housing 10 through the optical window 11 and to receive the reflected light OA2 incident onto the housing 10 through the optical window 11, and a heat conductive member 50 that connects the optical sensor 30 to the housing 10 to form a heat conductive path from the optical sensor 30 to the housing 10. A projection and incident optical system 90 may be between the optical sensor 30 and the optical window 11 as necessary.

Figure 3:
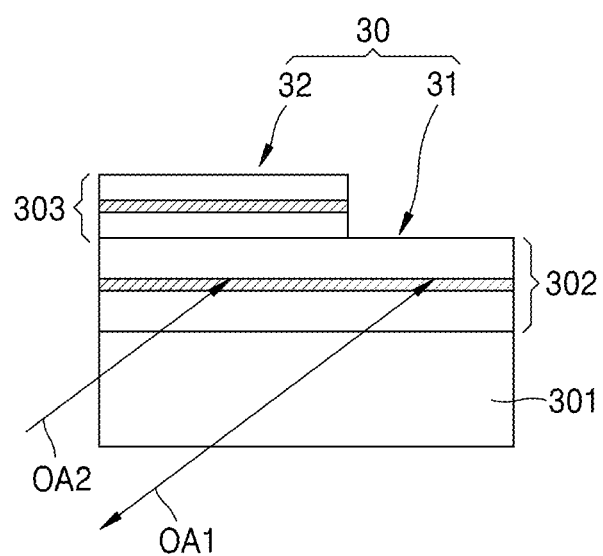
FIG. 3 is a configuration diagram of an example embodiment of the optical sensor shown in FIG. 2.

FIG. 3 is a configuration diagram of an example embodiment of the optical sensor 30. Referring to FIG. 3, the optical sensor 30 may include at least one light emitter 31 and at least one light receiver 32. The light emitter 31 may generate light in a wavelength band suitable for analyzing the location and shape of the object OBJ, for example, light having a wavelength in an infrared band. The light emitter 31 may include a plurality of light emitters that generate light of different wavelength bands. For example, the light emitter 31 may include a first light emitter that emits light in a first wavelength band, and a second light emitter that emits light in a second wavelength band different from the first wavelength band. The number of wavelength bands is not limited thereto, and the light emitter 31 may include light emitters that generate light in various types of wavelength bands.

The at least one light emitter 31 and the at least one light receiver 32 may be integral. The at least one light emitter 31 and the at least one light receiver 32 may form a one-dimensional array or a two-dimensional array. The at least one light emitter 31 and the at least one light receiver 32 may be separated from each other to form a light-emitting portion and a light-receiving portion, respectively. In the example embodiment of the optical sensor 30 shown in FIG. 3, the at least one light emitter 31 and the at least one light receiver 32 are integral.

Referring to FIG. 3, the optical sensor 30 may include a substrate 301, a light emitting material layer 302 formed on the substrate 301 to form the light emitter 31, and a light-receiving material layer 303 formed on a partial region of the light-emitting material layer 302 to form the light receiver 32. The partial area of the light-emitting material layer 302 on which the light-receiving material layer 303 is formed may be a non-emission area. The light-emitting material layer 302 and the light-receiving material layer 303 may be formed directly on the substrate 301 through a series of sequential processes, for example, a semiconductor process including deposition, photo-lithography, and etching. The light-emitting material layer 302 and the light-receiving material layer 303 may form a monolithically integrated structure on the substrate 301.

The light-emitting material layer 302 may include a plurality of layers of semiconductor materials, and may include, for example, a group III-V semiconductor compound, a group II-VI semiconductor compound, and a group IV semiconductor material. The light-emitting material layer 302 may have a laser structure including a gain layer, a clad layer, and a cavity, and may be formed, for example, in a vertical cavity surface emitting laser (VCSEL) structure. The light emitting material layer 302 may be formed on the substrate 301 through a semiconductor process, and the substrate 301 may be a semiconductor substrate suitable for forming the above-described semiconductor material. For example, the substrate 301 may be a GaAs substrate, a sapphire substrate, an InP substrate, a Si substrate, an insulator substrate, or the like. The light emitting material layer 302 may include AlGaN, GaInN, ZnSSe, ZnCDSe, AlGaInP/GaAs, Ga0.5In0.5P/GaAs, GaAlAs/GaAs, GaAs/GaAs, InGaAs/GaAs, InGaAsP/InP, InGaAsSb, PbCdS, Quantum cascade, PbSSe, PbSnTe, PbSnSe, or the like. For example, AlGaN may be used to generate light in a wavelength band of 350 nm to 400 nm, GaInN may be used to generate light in a wavelength band of 375 nm to 440 nm, ZnSSe may be used to generate light in a wavelength band of 447 nm to 480 nm, ZnCDSe may be used to generate light in a wavelength band of 490 nm to 525 nm, AlGaInP/GaAs may be used to generate light in a wavelength band of 620 nm to 680 nm, Ga0.5In0.5P/GaAs may be used to generate light in a wavelength band of 670 nm to 680 nm, GaAlAs/GaAs may be used to generate light in a wavelength band of 750 nm to 900 nm, GaAs/GaAs may be used to generate light in a wavelength band of 904 nm, InGaAs/GaAs may be used to generate light in a wavelength band of 915 nm to 1050 nm, InGaAsP/InP may be used to generate light in a wavelength band of 1100 nm to 1650 nm, InGaAsSb may be used to generate light in a wavelength band of 2 μm to 5 μm, PbCdS may be used to generate light in a wavelength band of 2.7 μm to 4.2 μm, a quantum cascade may be used to generate light in a wavelength band of 3 μm to 50 μm, PbSSe may be used to generate light in a wavelength band of 4.2 μm to 8 μm, PbSnTe may be used to generate light in a wavelength band of 6.5 μm to 30 μm, and PbSnSe may be used to generate light in a wavelength band of 8 μm to 30 μm. The light-emitting material layer 302 may be formed of a plurality of layers in which such a material is implemented as a positive type (P-type), an intrinsic type (I-type), or a negative type (N-type). A specific composition of the semiconductor material is determined in consideration of a wavelength band of light to be emitted. The light-emitting material layer 302 is illustrated as three layers, but is not limited thereto, and may be composed of three or more layers. The light emitting material layer 302 may include a mirror layer for forming a resonance structure. For example, a distributed Bragg reflector (hereinafter referred to as DBR) composed of pairs of two materials having different refractive indices may be provided to form a resonant cavity. In addition, a light-emitting material layer 302 may include an oxide aperture for controlling a mode of oscillated light or a beam size. In addition, the light-emitting material layer 302 may include an electrode structure for current injection. Furthermore, the light-emitting material layer 200 may include a contact layer doped with a high concentration of P-type or N-type dopants to lower the contact resistance with an electrode.

An area of the light-emitting material layer 302 forming the light emitter 31 may be a light-emitting area, and a partial area of the light-emitting material layer 302 on which the light-receiving material layer 303 is formed may be a non-emission area. The non-emission area may be formed such that an electrode for current injection is not included. However, although the structures of the light-emitting area and the non-emission area may be the same, an electrode in the non-emission area may be configured such that current injection is not performed in connection with a driver (e.g., a driver circuit) 40. The light OA1 emitted to the optical window 11 may be implemented by a plurality of lights emitted from a plurality of light emitters 31.

The light emitter 31 shown in FIG. 3 is exemplary. The light emitter 31 may have various structures such as a surface-emitting laser device structure, a semiconductor laser device structure, and a micro electro mechanical system (MEMS) light emitter structure. Furthermore, when a Si-based phases array element (Si-OPA) using Si photonics technology compatible with a semiconductor CMOS process is used as a light emitter 31, the light-emitting element 31 may be largely composed of a laser input unit, a beam divergence unit, a phase modulation unit, an optical amplification unit, and an output unit. In this case, an input beam of a single wavelength may be one-dimensionally steered in a direction not parallel to a waveguide direction of an output terminal (e.g., vertically) by phase modulation. In addition, by sequentially inputting laser beams of various wavelengths, an input beam may be steered horizontally with the waveguide of the output terminal. Therefore, two-dimensional beam steering is possible using phase modulation and a wavelength modulation method. In this case, when a wavelength-tunable laser diode is integrated in Si-OPA, the wavelength may be varied at high speed, and thus a compact optical sensor 30 may be manufactured. Instead of a Si or $Si_3N_4$ based phase modulation array, an edge emitting semiconductor laser diode or a surface emitting laser diode may be used as the light-emitting element 31.

The light-receiving material layer 303 may include, for example, a group III-V semiconductor compound, a group II-VI semiconductor compound, and a group IV semiconductor material, and may be formed of a photodiode. The light-emitting material layer 303 may include a plurality of layers in which the semiconductor materials are implemented as a P-type, an I-type, or an N-type. In the drawing, the light-receiving material layer 303 is illustrated as three layers, but this is illustrative and is not limited thereto. The light-receiving material layer 303 may include an electrode structure for detecting an optical signal as an electrical signal in addition to the semiconductor materials. The light receiver 32 shown in FIG. 3 is exemplary. In general, the light receiver 32 may be a PIN photodiode, an avalanche photodiode for detecting a small amount of light, or a single-photon avalanche diode (SPAD) array.

The optical sensing device 1 may include the driver 40. The driver 40 drives the optical sensor 30. For example, the driver 40 may include a light-emission controller and an optical signal analyzer. The light-emission controller may include a power element for supplying current to the light-emitting element 31, a control element for driving and controlling the light-emitting element 31 and the light receiver 32, and the like. The light-emission controller may perform power supply control, on/off control, pulse wave (PW) or continuous wave (CW) generation control, for example, to the light-emitting element 31. An optical signal analyzer may analyze an optical signal from the object OBJ received by the light receiver 32 to analyze the existence, location, shape, and physical properties of the object OBJ. For example, the optical signal analyzer may perform an operation for measuring an optical flight time and determination of a three-dimensional shape of the object OBJ therefrom. The optical signal analyzer may also analyze the type, component, concentration, and physical properties of the object OBJ by a Raman analysis method that detects a wavelength shift caused by the object OBJ. The optical sensor 30 and the driver 40 are arranged on the substrate 20. The substrate 20 may be, for example, a printed circuit board. The housing 10 accommodates the substrate 20, the optical sensor 30, and the driver 40. The housing 10 may form the exterior of the optical sensing device 1.

In this way, heat is generated in an optical sensor 30 and the driver 40 in the process of driving the optical sensor 30. Light-emitting characteristics of the light emitter 31 may be affected by temperature. Heat generated during the driving process may hinder the normal operation of the optical sensor 30 by changing the wavelength and intensity of light emission. When the wavelength and intensity of light emission are unstable, sensing accuracy and sensing reliability of the optical sensing device 1 may be deteriorated. In addition, heat generated during the driving process may negatively affect the life of the light emitter 31. Therefore, it is necessary to exhaust heat generated in the driving process of the optical sensor 30 to the outside of the optical sensing device 1.

Referring to FIG. 2, the optical sensing device 1 may include the heat conductive member 50 forming a heat conductive path between at least the light emitter 31 and the housing 10. Accordingly, heat of the light emitter 31 is quickly transferred to the housing 10. In the present example embodiment, the heat conductive member 50 forms a heat conductive path between the optical sensor 30 including the light emitter 31 and the light receiver 32 and the housing 10. Accordingly, heat of the optical sensor 30 is quickly transferred to the housing 10. The heat conductive member 50 may include a material having high thermal conductivity. The heat conductive member 50 may include a metal having high thermal conductivity, such as copper, aluminum, or the like. In an example embodiment, the heat conductive member 50 may include a cooling plate 51 in contact with the optical sensor 30 and a cooling fin 52 connecting the cooling plate 51 to the housing 10. The cooling plate 51 may directly contact the optical sensor 30. The cooling plate 51 may be adhered to the optical sensor 30 by a heat conductive adhesive.

As shown in FIG. 2, the cooling plate 51 and the housing 10 may be connected to each other by a plurality of cooling fins 52 arranged at intervals. The plurality of cooling fins 52 may be connected to an upper portion 12 of the housing 10. The plurality of cooling fins 52 may extend to a side wall 13 of the housing 10 and may be apart from the side wall 13 of the housing 10. The intervals between the plurality of cooling fins 52 may be uniform or may be non-uniform. The plurality of cooling fins 52 may be integrally formed with the cooling plate 51 and connected to the housing 10. The plurality of cooling fins 52 may be integrally formed with the housing 10 and connected to the cooling plate 51.

The optical sensing device 1 may be mounted on a moving body such as a vehicle or a drone, or may be installed on a fixed body. The housing 10 is exposed to an external atmosphere. The housing 10 is cooled by air flowing along the outer surface of the housing 10. Heat generated by the optical sensor 30 is transferred to the housing 10 through the heat conductive member 50 and is exhausted from the housing 10 by external air. Accordingly, heat generated by the optical sensor 30 may be quickly transferred to the outside of the optical sensing device 1 to cool the optical sensor 30.

The cooling plate 51 may contact the driver 40. For example, the cooling plate 51 may directly contact the driver 40. The cooling plate 51 may be adhered to the driver 40 by a heat conductive adhesive. With this configuration, heat generated from the driver 40 may be transferred to the housing 10 to cool the driver 40.

By reducing the flow resistance of air flowing along the housing 10, the housing 10 may be cooled more easily. In this regard, at least a portion of the housing 10 may be streamlined and may be formed with a flat and smooth surface without projections, lumps, indentations, concave portions, and/or convex portions, or a curved and smooth surface having a consistent curvature, without projections, lumps, indentations, concave portions, and/or convex portions. The streamlined type refers to a shape that may reduce air flow resistance, and may be various, such as a cylindrical shape, a dome shape, and a water drop shape. In the present embodiment, the housing 10 is generally cylindrical, and the upper portion 12 of the housing 10 is domed. The plurality of cooling fins 52 extend from the cooling plate 51 and are connected to the streamlined portion of the housing 10, that is, the upper portion 12. With such a configuration, the housing 10 may be easily cooled by the air flowing along the upper portion 12, and thus, a cooling effect of the optical sensor 30 may be improved. In addition, by employing the plurality of cooling fins 52, an area for absorbing heat from inside the housing 10 may be increased. Thereby, an improved cooling effect may be obtained.

Figure 4:
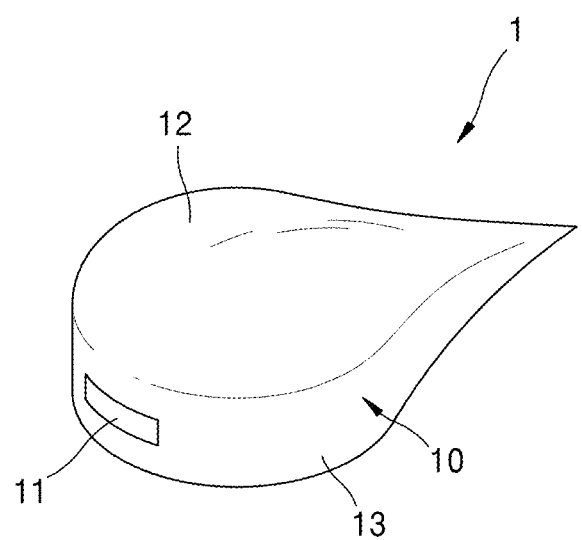
FIG. 4 is a perspective view of an example embodiment of an optical sensing device.

FIG. 4 is a perspective view of an example embodiment of the optical sensing device 1. Referring to FIG. 4, the upper portion 12 and the side wall 13 of the housing 10 are generally streamlined. Accordingly, the flow resistance of air flowing along an outer surface of the housing 10 is reduced, thereby improving a cooling effect. The shape of the housing 10 is not limited to the example shown in FIG. 4.

Figure 5:
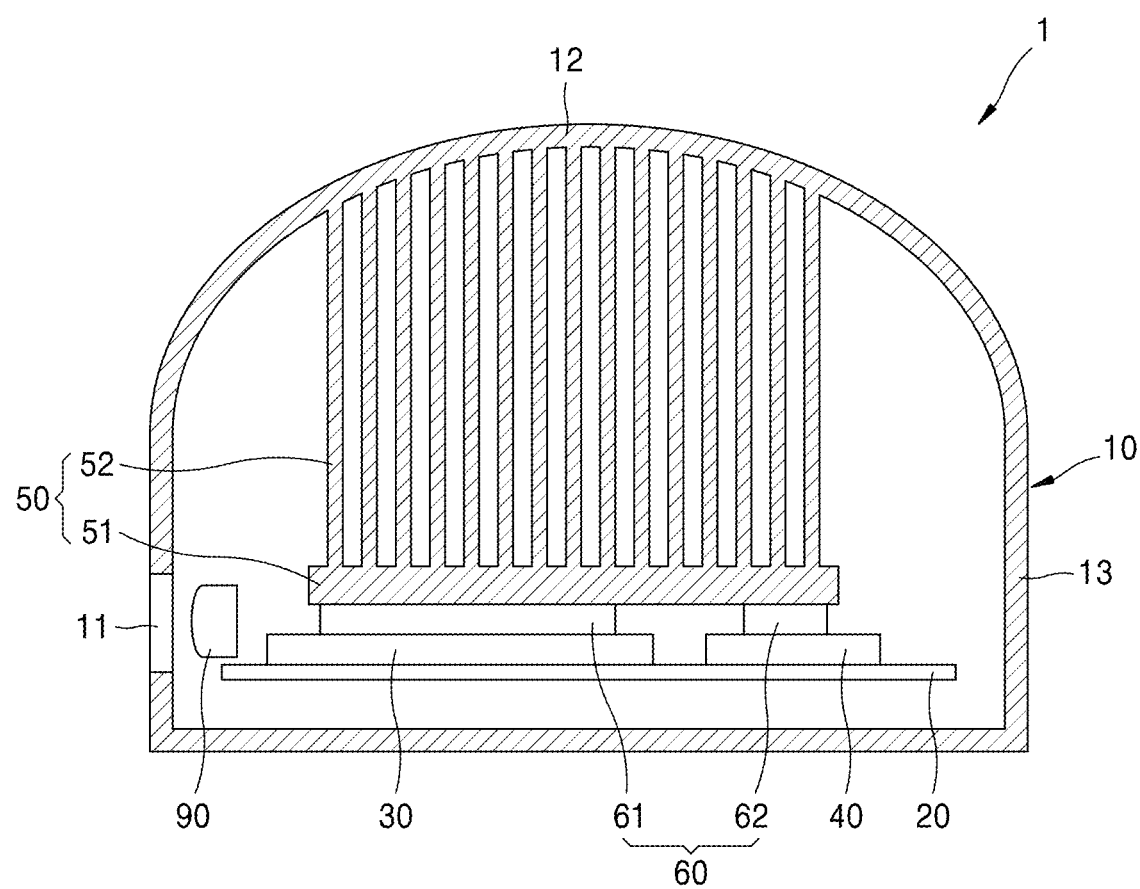
FIG. 5 is a cross-sectional view of an example embodiment of an optical sensing device.

FIG. 5 is a cross-sectional view of an example embodiment of the optical sensing device 1. The optical sensing device 1 of the present embodiment is different from the optical sensing device 1 of the embodiment shown in FIG. 2 in that the optical sensing device 1 of the present embodiment further includes a thermoelectric cooler 60. Hereinafter, the differences will be mainly described.

FIG. 5 shows the thermoelectric cooler 60. The thermoelectric cooler 60 is a cooler using a Peltier effect and may be formed of a PN junction semiconductor. The thermoelectric cooler 60 may adjust the amount of heat absorbed according to the amount of current supplied. For example, the thermoelectric cooler 60 may include a first thermoelectric cooler 61 interposed between the optical sensor 30 and the heat conductive member 50 to pump heat from the optical sensor 30 to the heat conductive member 50. For example, a heat absorbing side of the first thermoelectric cooler 61 may directly contact the optical sensor 30 and may be adhered to the optical sensor 20 by a heat conductive adhesive. A heat radiation side of the first thermoelectric cooler 61 may be in contact with the cooling plate 51 of the heat conductive member 50 and may be adhered to the cooling plate 51 by the heat conductive adhesive. With this configuration, the first thermoelectric cooler 61 may function as a heat pump that absorbs heat energy from the optical sensor 30 and transfers the heat energy to the cooling plate 51, and may effectively cool the optical sensor 30.

For example, the thermoelectric cooler 60 may include a second thermoelectric cooler 62 interposed between the driver 40 and the heat conductive member 50 to pump heat from the driver 40 to the heat conductive member 50. For example, the heat absorbing side of the second thermoelectric cooler 62 may contact the driver 40, and the heat radiation side of the second thermoelectric cooler 62 may contact the cooling plate 51 of the heat conductive member 50. However, the heat absorbing side and the heat radiation side of the second thermoelectric cooler 62 may be adhered to the driver 40 and the cooling plate 51 of the heat conductive member 50 respectively by a heat conductive adhesive. With this configuration, the second thermoelectric cooler 62 may function as a heat pump that absorbs heat energy from the driver 40 and transfers the heat energy to the cooling plate 51, and may effectively cool the driver 40.

Figure 6:
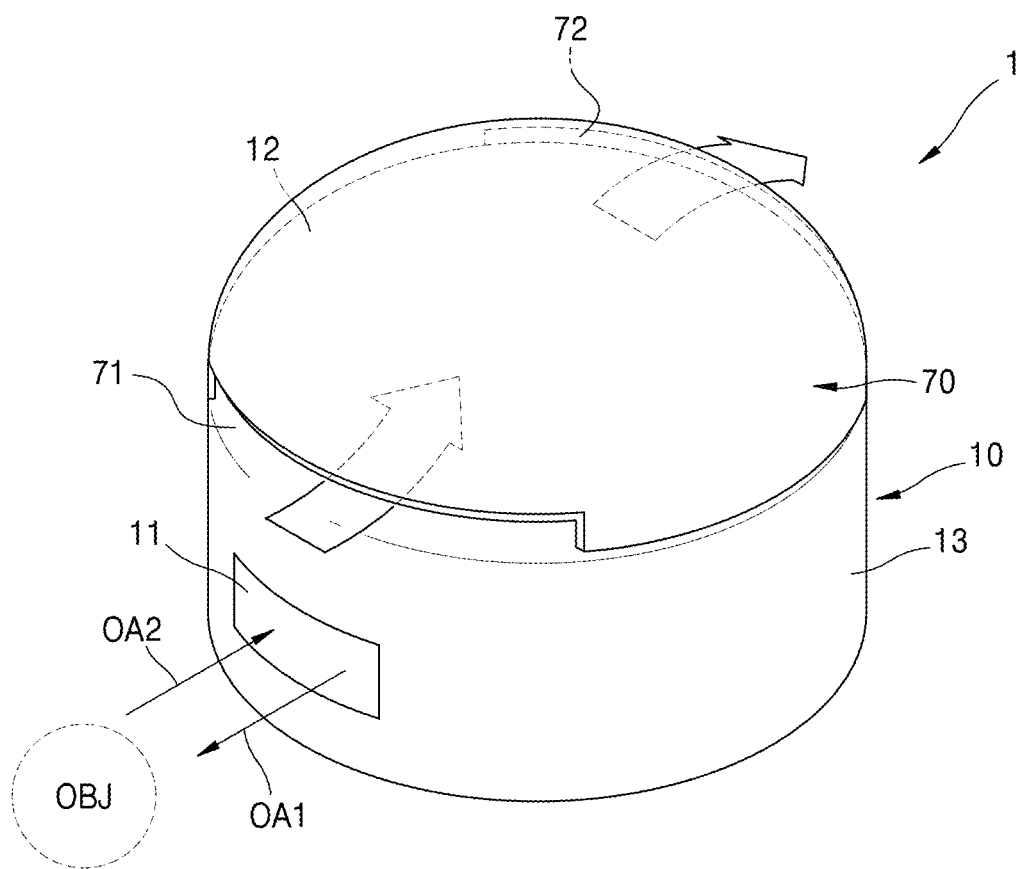
FIG. 6 is a perspective view of an example embodiment of an optical sensing device.
Figure 7:
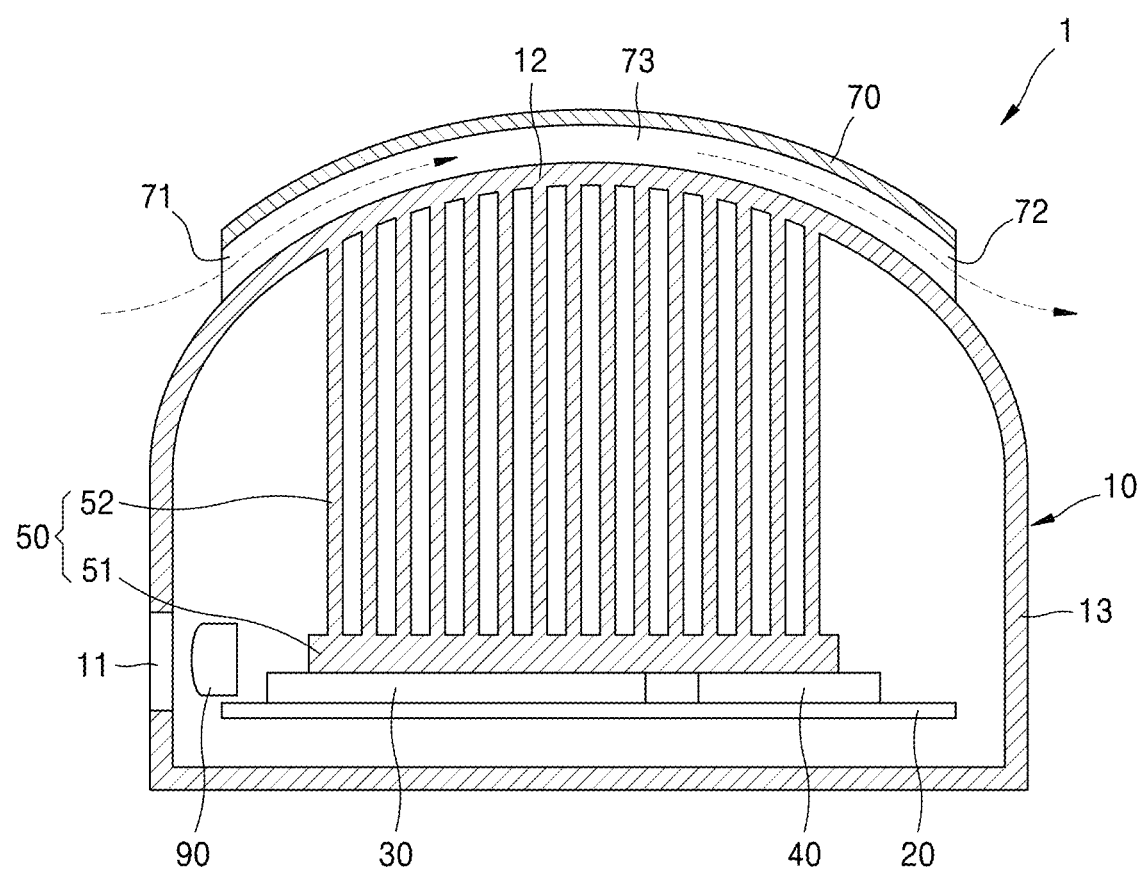
FIG. 7 is a cross-sectional view of an example embodiment of the optical sensing device shown in FIG. 6.

FIG. 6 is a perspective view of an example embodiment of the optical sensing device 1, and FIG. 7 is a cross-sectional view of an example embodiment of the optical sensing device 1 shown in FIG. 6. The optical sensing device 1 of the present embodiment is different from the optical sensing device 1 of the embodiment shown in FIG. 2 in that the optical sensing device 1 of the present embodiment further includes a cooling channel forming member 70. Hereinafter, the differences will be mainly described.

Referring to FIGS. 6 and 7, the optical sensing device 1 may include the cooling channel forming member 70 forming a cooling channel 73 through which a fluid flows along the outer periphery of the housing 10 together with the housing 10. The cooling channel forming member 70 may be also referred to as a cover plate. For example, the cooling channel forming member 70 may be arranged to be apart from a portion of the housing 10, for example, the upper portion 12. Accordingly, the cooling channel 73 may be formed such that air may flow between the cooling channel forming member 70 and the upper portion 12 of the housing 10. The cooling fins 52 of the heat conductive member 50 may be connected to a portion of the housing 10 in which the cooling channel 73 is formed, for example, the upper portion 12. Air is introduced into the cooling channel 73 through an inlet 71, takes heat from the upper portion 12 of the housing 10 while passing through the cooling channel 73, and is exhausted from the cooling channel 73 through an outlet 72. With such a configuration, the optical sensor 20 and the driver 40 may be cooled by forming the housing 10. The thermoelectric cooler 60 described in FIG. 5 may also be applied to the embodiment of the optical sensing device 1 shown in FIGS. 6 and 7.

Figure 8:
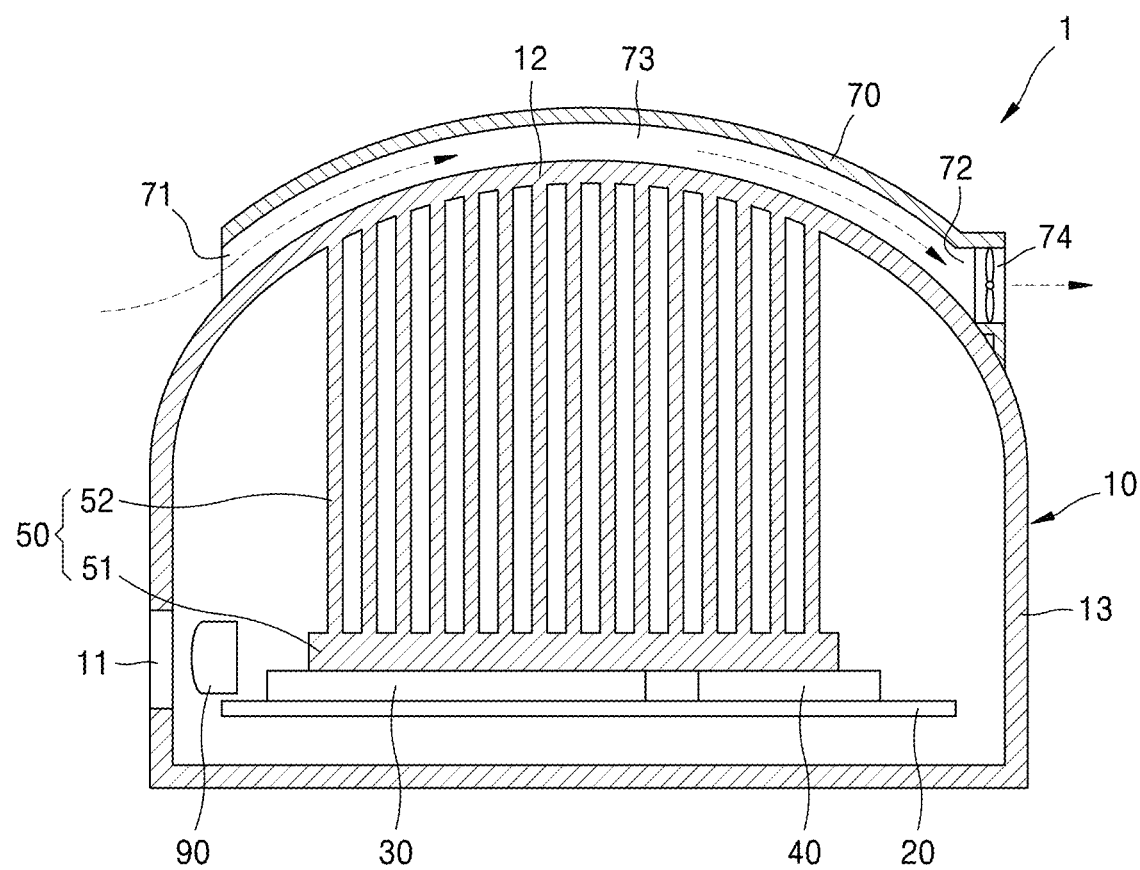
FIG. 8 is a cross-sectional view of an example embodiment of an optical sensing device.

FIG. 8 is a cross-sectional view of an example embodiment of the optical sensing device 1. The optical sensing device 1 of the present embodiment is different from the optical sensing device 1 of the embodiments shown in FIGS. 6 and 7 in that the optical sensing device 1 of the present embodiment further includes a fan 74 for supplying air to the cooling channel 73. Hereinafter, the differences will be mainly described. Referring to FIG. 8, the fan 74 is at the outlet 72 of the cooling channel 73. The fan 74 is operated in a direction to suck air from the inlet 71. Accordingly, even when the optical sensing device 1 is used in a stopped state, the housing 10 may be effectively cooled by inducing a flow of air in the cooling channel 73. The fan 74 may be arranged at the inlet 71 of the cooling channel 73, or may be arranged between the inlet 71 and the outlet 72. The thermoelectric cooler 60 described in FIG. 5 may also be applied to the embodiment of the optical sensing device 1 shown in FIG. 8. The thermoelectric cooler 60 described in FIG. 5 may also be applied to the embodiment of the optical sensing device 1 shown in FIG. 8.

Figure 9:
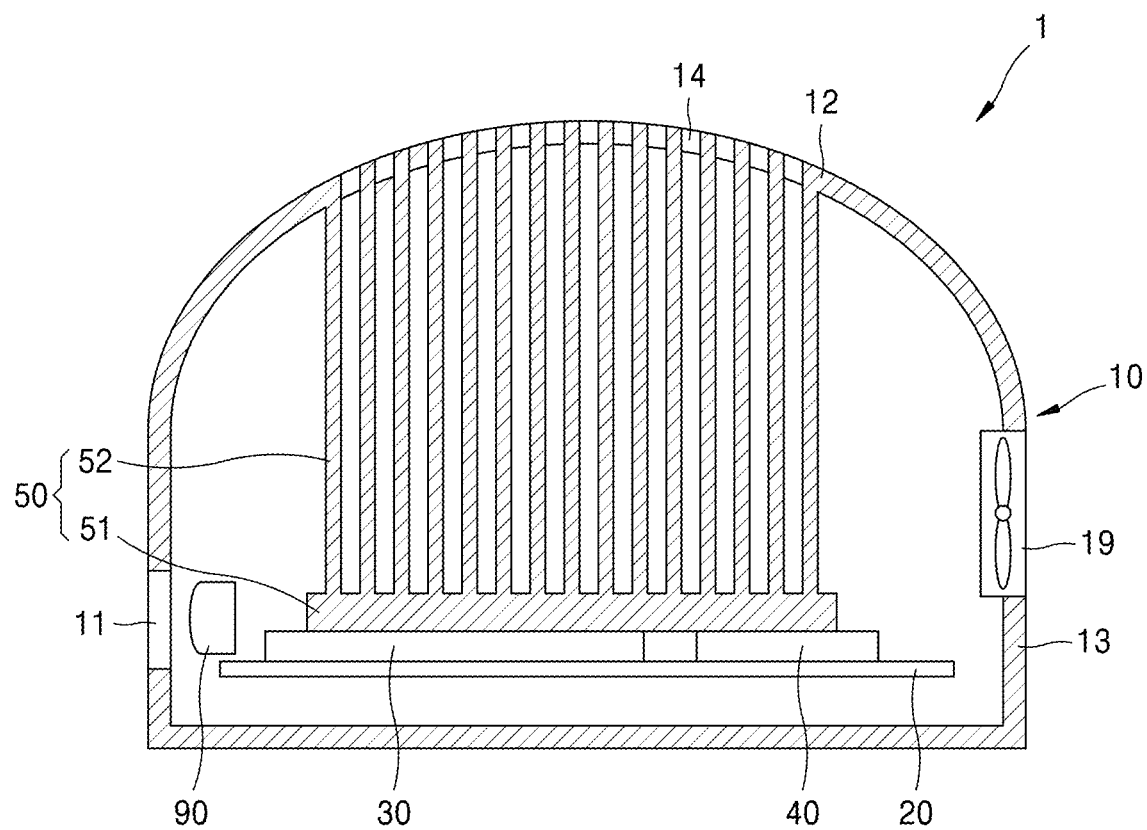
FIG. 9 is a cross-sectional view of an example embodiment of an optical sensing device.

FIG. 9 is a cross-sectional view of an example embodiment of the optical sensing device 1. The optical sensing device 1 of the present embodiment is different from the optical sensing device 1 of the embodiment shown in FIG. 2 in that an air vent 14 is provided in the housing 10 and the air inside the housing 10 is exhausted to the outside by using a fan 19. The air vent 14 may be provided in the upper portion 12 and/or the side wall 13 of the housing 10. In the present embodiment, an air vent 14 is provided in the upper portion 12 of the housing 10. The air vent 14 may be provided in an area corresponding between the plurality of cooling fins 52 of the upper portion 12 of the housing 10 so that air may be supplied between the plurality of cooling fins 52. The fan 19 exhausts the air from inside the housing 10 to the outside.

Heat generated from the optical sensor 30 and the driver 40 is transferred to the housing 10 through the cooling plate 51 and the cooling fin 52, and is exhausted from the housing 10 by air flowing along the outer periphery of the housing 10. Air introduced into the housing 10 through the air vent 14 cools the cooling fins 52 and the cooling plate 51 and is exhausted to the outside of the housing 10 by the fan 19. With this configuration, the optical sensor 30 and the driver 40 may be cooled more easily. Furthermore, because the air inside the housing 10 is exhausted to the outside by the fan 19, cooling efficiency may be improved. The thermoelectric cooler 60 described in FIG. 5 may also be applied to the embodiment of the optical sensing device 1 shown in FIG. 9.

Figure 10:
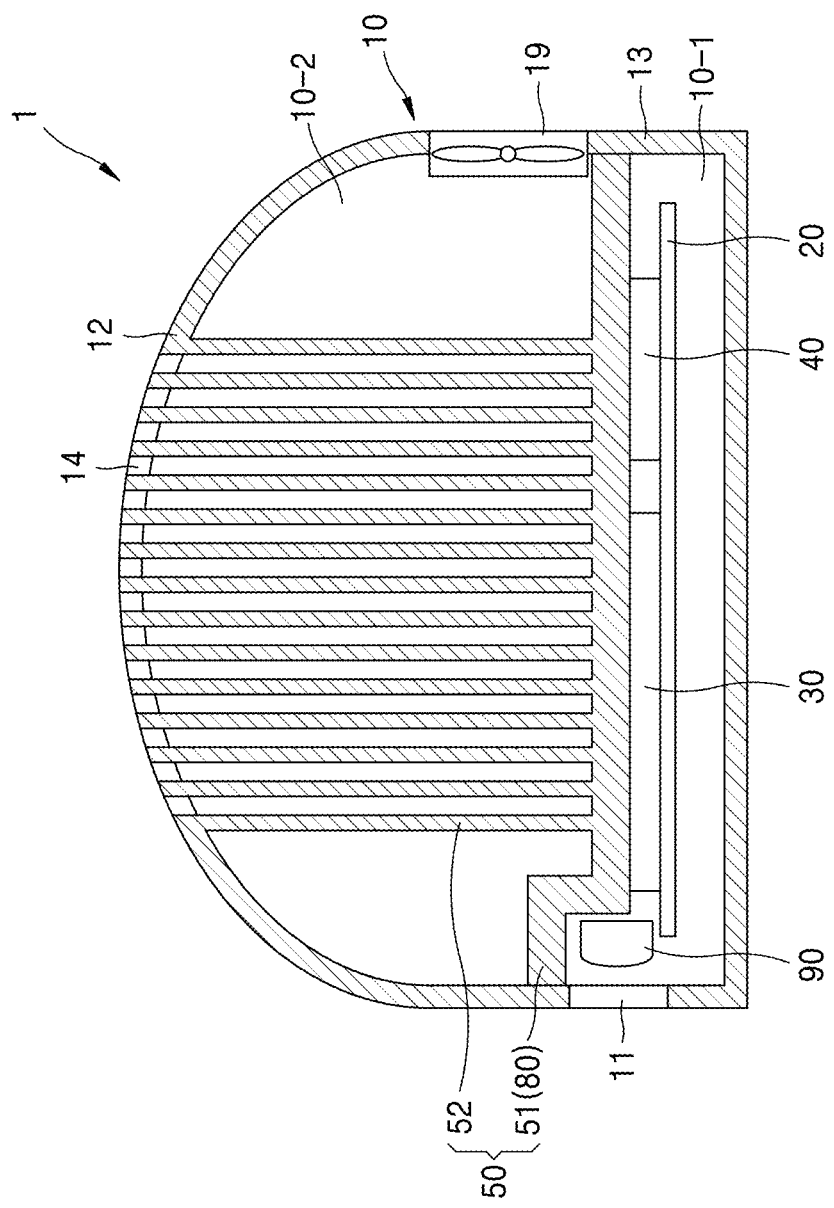
FIG. 10 is a cross-sectional view of an example embodiment of an optical sensing device.

FIG. 10 is a cross-sectional view of an example embodiment of the optical sensing device 1. The optical sensing device 1 of the present embodiment is different from the optical sensing device 1 of the embodiment shown in FIG. 9 in that an inner space of the housing 10 is divided into a first space 10-1 and a second space 10-2. Hereinafter, the differences will be mainly described. Referring to FIG. 10, the inner space of the housing 10 is divided into the first space 10-1 and the second space 10-2 by an isolation plate 80. In the present embodiment, the cooling plate 51 extends to the side wall 13 of the housing 10 and functions as the isolation plate 80 that divides the inner space of the housing 10 into the first space 10-1 and the second space 10-2. The isolation plate 80 may be a separate plate. The optical sensor 30 is arranged in the first space 10-1. The driver 40 may be arranged in the first space 10-1. The heat conductive member 50 is arranged in the second space 10-2. The air vent 14 is formed to communicate with the second space 10-2. The fan 19 exhausts air in the second space 10-2 to the outside.

Heat generated from the optical sensor 30 and the driver 40 is transferred to the housing 10 through the cooling plate 51 and the cooling fin 52, and is exhausted from the housing 10 by air flowing along the outer periphery of the housing 10. Air introduced into the second space 10-2 through the air vent 14 cools the cooling fin 52 and the cooling plate 51, and is exhausted from the second space 10-2 by the fan 19. With this configuration, the optical sensor 30 and the driver 40 may be cooled more easily. In addition, because the second space 10-2 into which external air is introduced is separated from the first space 10-1 in which the optical sensor 30, etc. are installed, the optical sensor 30 installed in the first space 10-1 may be protected from foreign substances or the like flowing into the second space 10-2 through the air vent 14. The thermoelectric cooler 60 described in FIG. 5 may also be applied to the embodiment of the optical sensing device 1 shown in FIG. 10.

Figure 11:
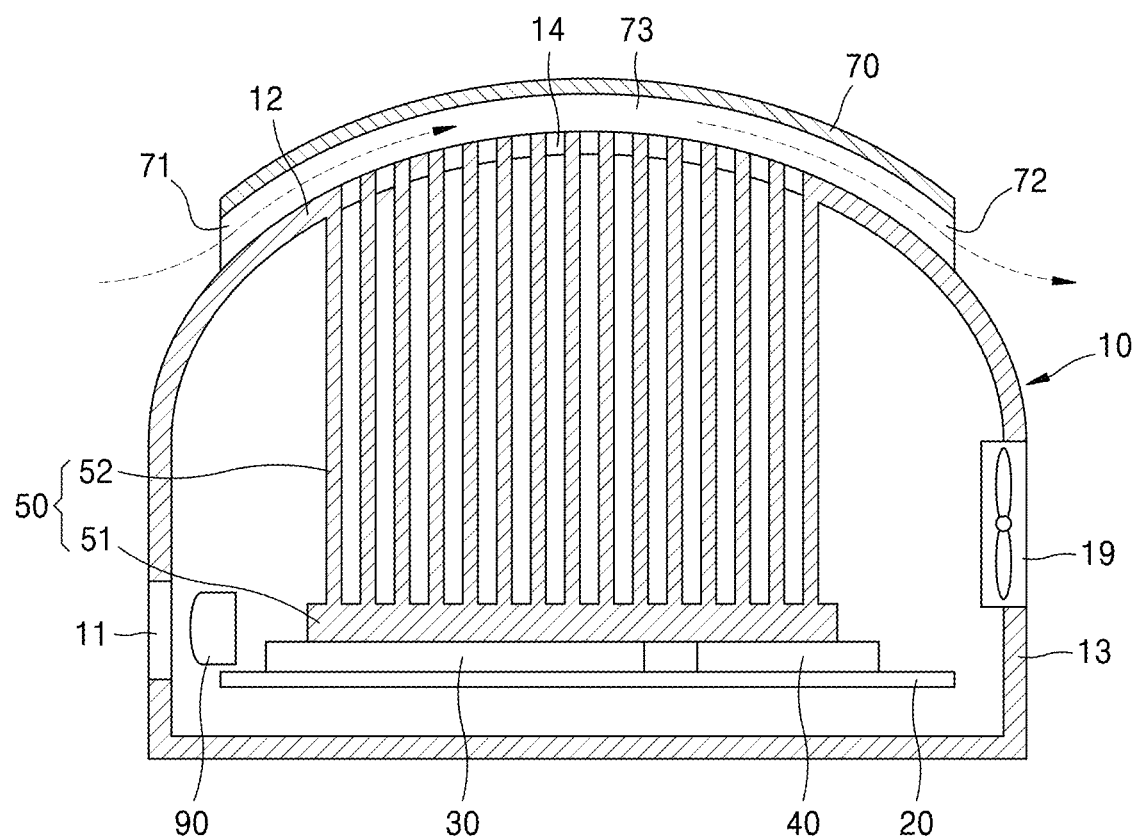
FIG. 11 is a cross-sectional view of an example embodiment of an optical sensing device.

FIG. 11 is a cross-sectional view of an example embodiment of the optical sensing device 1. The optical sensing device 1 of the present embodiment is different from the optical sensing device 1 of the embodiment shown in FIG. 9 in that the optical sensing device 1 of the present embodiment further includes the cooling channel forming member 70. That is, the optical sensing device 1 of the present embodiment is a form in which the embodiment of the optical sensing device 1 shown in FIG. 7 and the embodiment of the optical sensing device 1 shown in FIG. 9 are combined.

Referring to FIG. 11, the optical sensing device 1 may include the cooling channel forming member 70 forming the cooling channel 73 through which a fluid flows along the outer periphery of the housing 10 together with the housing 10. The air vent 14 may be formed in an area corresponding to the cooling channel 73 of the housing 10. The cooling channel forming member 70 may be arranged to be apart from a portion of the housing 10, for example, the upper portion 12. Accordingly, the cooling channel 73 may be formed such that air may flow between the cooling channel forming member 70 and the upper portion 12 of the housing 10. The cooling fins 52 of the heat conductive member 50 may be connected to a portion of the housing 10 in which the cooling channel 73 is formed, for example, the upper portion 12. Air is introduced into the cooling channel 73 through an inlet 71, takes heat from the upper portion 12 of the housing 10 while passing through the cooling channel 73, and is exhausted from the cooling channel 73 through an outlet 72. Air introduced into the cooling channel 73 through the inlet 71 enters the housing 10 through the air vent 14, cools the cooling fins 52 and the cooling plate 51, and is exhausted to the outside of the housing 10 by the fan 19. The thermoelectric cooler 60 described in FIG. 5 may also be applied to the embodiment of the optical sensing device 1 shown in FIG. 11.

Figure 12:
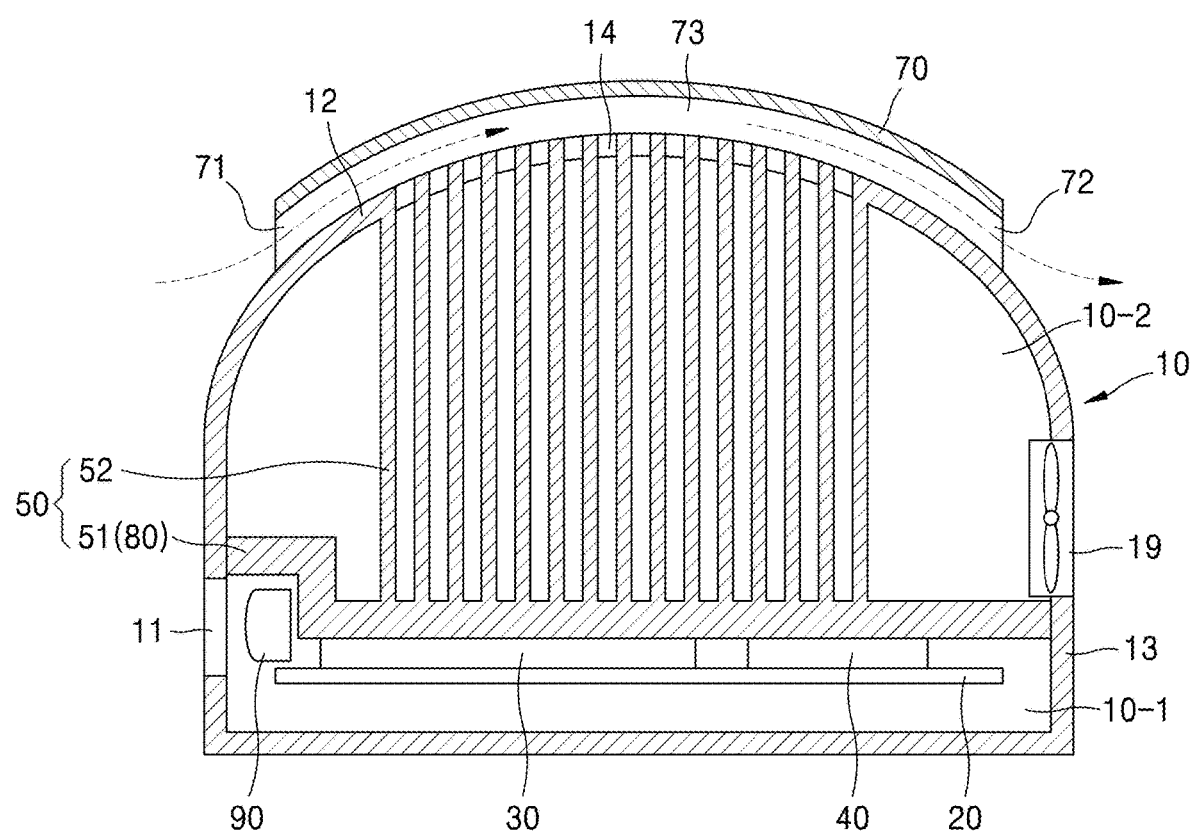
FIG. 12 is a cross-sectional view of an example embodiment of an optical sensing device.

FIG. 12 is a cross-sectional view of an example embodiment of the optical sensing device 1. The optical sensing device 1 of the present embodiment is different from the optical sensing device 1 of the embodiment shown in FIG. 11 in that an inner space of the housing 10 is divided into the first space 10-1 and the second space 10-2. That is, the optical sensing device 1 of the present embodiment is a form in which the embodiment of the optical sensing device 1 shown in FIG. 7 and the embodiment of the optical sensing device 1 shown in FIG. 10 are combined. With this configuration, heat generated from the optical sensor 30 and the driver 40 is transferred to the housing 10 through the cooling plate 51 and the cooling fin 52, and is exhausted from the housing 10 by air flowing along the cooling channel 73. A portion of the air flowing along the cooling channel 73 flows into the second space 10-2 through the air vent 14, cools the cooling fin 52 and the cooling plate 51, and is exhausted from the second space 10-2 by the fan 19. The thermoelectric cooler 60 described in FIG. 5 may also be applied to the embodiment of the optical sensing device 1 shown in FIG. 12.

The optical sensing device 1 may be used as a sensor that obtains 3D information about a front object in real time, and thus, may be applied to autonomously driven devices, for example, driverless vehicles, autonomous vehicles, robots, drones, etc. In addition, the optical sensing device 1 may be applied to a small walking device (bicycles, motorcycles, strollers, boards, etc.), a person and animal assistance device (stands, helmets, clothes, jewelry, watches, bags, etc.), an Internet of Thing (IoT) device, a building security device, and the like . . . .

Figure 13:
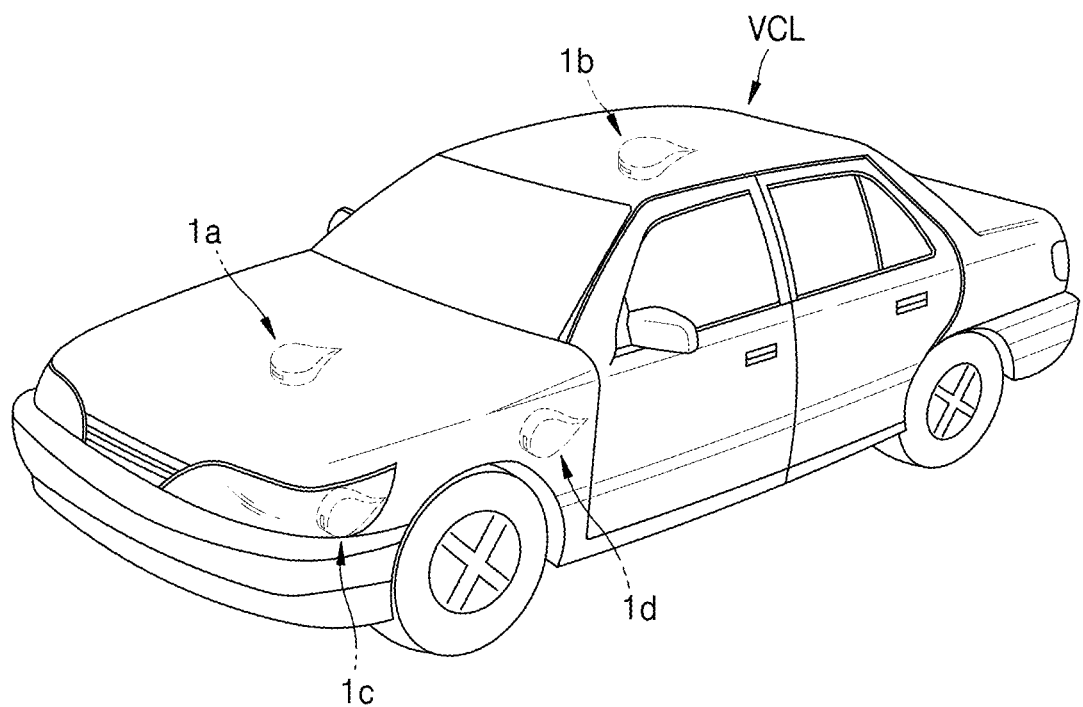
FIG. 13 is a view illustrating various examples in which an optical sensing device is applied to a moving object.

FIG. 13 shows various examples in which an optical sensing device is applied to a moving object VCL. Referring to FIG. 13, the moving object VCL may be, for example, a vehicle. As indicated by reference numerals 1a, 1b, 1c, and 1d, respectively, the optical sensing device may be installed on a front hood, a roof, near a head lamp, or a front fender of a vehicle. The optical sensing device may be installed to protrude from the exterior of the vehicle. In this case, the housing 10 may form a portion of the exterior of the vehicle. At least a portion of the housing 10 exposed from the exterior of the vehicle may be streamlined. As a result, a natural flow of air is formed along the outer surface of the housing 10, so that a cooling effect of the optical sensor 30 may be improved. When the cooling channel forming member 70 is employed, the cooling channel forming member 70 may be implemented by a portion of the exterior of the vehicle. The optical sensing device may be installed inside the exterior of the vehicle. in this case, an air vent serving as an air inlet path for cooling the housing 10 of the optical sensing device may be provided on the exterior of the vehicle.

According to the above-described optical sensing device, heat during operation may be radiated to the outside through the housing, thereby improving operational reliability of the optical sensing device.

The above-described optical sensing system may be employed in various optical devices and electronic devices, and may be employed in, for example, a LiDAR device to obtain information about a subject.

The foregoing embodiments are merely examples and are not to be construed as limiting. The present teaching can be readily applied to other types of apparatuses. Also, the description of the example embodiments is intended to be illustrative, and not to limit the scope of the claims, and many alternatives, modifications, and variations will be apparent to those skilled in the art.

What is claimed is:

1. An optical sensing device comprising:
   a housing comprising an upper portion, side walls, and an optical window that is provided on one of the side walls;
   a substrate provided in the housing;
   an optical sensor provided on the substrate and configured to radiate light to an outside of the housing through the optical window and to receive the light that returns to the housing through the optical window; and
   a heat conductive member that is physically and directly connected to the optical sensor and the upper portion of the housing, and that is configured to conduct heat from the optical sensor to the upper portion of the housing.

2. The optical sensing device of claim 1, wherein the heat conductive member comprises:
   a cooling plate contacting the optical sensor; and
   a plurality of cooling fins that extends from the cooling plate to the upper portion of the housing, and that is physically and directly connected to the cooling plate and the upper portion of the housing.

3. The optical sensing device of claim 1, further comprising:

a thermoelectric cooler provided between the optical sensor and the heat conductive member.

4. The optical sensing device of claim 1, further comprising:
a driver provided on the substrate and configured to drive the optical sensor,
wherein the heat conductive member is physically and directly connected to the driver and the upper portion of the housing.

5. The optical sensing device of claim 1, wherein the upper portion of the housing is curved, and the housing has cylindrical shape, a dome shape, or a water drop shape.

6. The optical sensing device of claim 1, further comprising:
a cover plate provided above an outer periphery of the upper portion of the housing and configured to form a cooling channel between the cover plate and the outer periphery of the upper portion of the housing to allow a fluid to flow along the outer periphery of the upper portion of the housing.

7. The optical sensing device of claim 6, further comprising:
a fan configured to supply air to the cooling channel.

8. The optical sensing device of claim 1, further comprising:
an air vent provided in the housing; and
a fan configured to exhaust air from an inside of the housing to the outside of the housing.

9. The optical sensing device of claim 8, further comprising:
an isolation plate that divides an inner space of the housing into a first space and a second space,
wherein the substrate and the optical sensor are provided in the first space, and the heat conductive member is provided in the second space,
the air vent is configured to communicate with the second space, and
the fan is configured to exhaust the air from the second space to the outside.

10. The optical sensing device of claim 9, wherein the heat conductive member comprises:
a cooling plate contacting the optical sensor; and
a cooling fin connected to the cooling plate and the housing, and
wherein the isolation plate extends from the cooling plate to divide the inner space into the first space and the second space.

11. The optical sensing device of claim 8, further comprising:
a cover plate provided above an outer periphery of the housing and configured to form a cooling channel between the cover plate and the housing to allow a fluid to flow along the outer periphery of the housing,
wherein the air vent is provided in an area of the housing corresponding to the cooling channel.

12. An optical sensing device comprising:
a housing comprising an upper portion, side walls, and an optical window that is provided on one of the side walls;
a light emitter provided in the housing and configured to radiate light to an outside of the housing through the optical window;
a light receiver provided in the housing and configured to receive the light that returns to the housing through the optical window; and
a heat conductive member comprising:
a cooling plate contacting the light emitter; and
a cooling fin that is physically and directly connected to the cooling plate and the upper portion of the housing, and that is configured to conduct heat from the light emitter to the upper portion of the housing.

13. The optical sensing device of claim 12, wherein the cooling plate contacts the light receiver.

14. The optical sensing device of claim 12, further comprising:
a driver configured to drive the light emitter and the light receiver,
wherein the cooling plate contacts the driver.

15. The optical sensing device of claim 12, further comprising:
a thermoelectric cooler provided between the light emitter and the cooling plate.

16. The optical sensing device of claim 12, further comprising:
a cover plate provided above an outer periphery of the housing and configured to form a cooling channel between the cover plate and the housing to allow a fluid to flow along the outer periphery of the housing.

17. The optical sensing device of claim 12, further comprising:
an air vent provided in the housing; and
a fan configured to exhaust air from inside the housing to the outside.

18. The optical sensing device of claim 17, further comprising: an isolation plate that divides an inner space of the housing into a first space and a second space,
wherein the light emitter and the light receiver are provided in the first space, the heat conductive member is provided in the second space,
the air vent is configured to communicate with the second space, and
the fan is configured to exhaust the air from the second space to the outside.

19. The optical sensing device of claim 18, wherein the isolation plate extends from the cooling plate to divide the inner space into the first space and the second space.

20. The optical sensing device of claim 17, further comprising:
a cover plate provided above an outer periphery of the housing and configured to form a cooling channel between the cover plate and the housing to allow a fluid to flow along the outer periphery of the housing,
wherein the air vent is provided in an area of the housing corresponding to the cooling channel.

* * * * *